(12) United States Patent
Shih et al.

(10) Patent No.: US 8,633,079 B2
(45) Date of Patent: Jan. 21, 2014

(54) METHOD FOR FABRICATING A SONOS MEMORY

(75) Inventors: Ping-Chia Shih, Hsin-Chu (TW); Yu-Cheng Yin, Tainan County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 649 days.

(21) Appl. No.: 12/690,924

(22) Filed: Jan. 20, 2010

(65) Prior Publication Data

US 2011/0177664 A1    Jul. 21, 2011

(51) Int. Cl.
*H01L 21/336*    (2006.01)

(52) U.S. Cl.
USPC .................................. 438/287; 257/E21.409

(58) Field of Classification Search
USPC ........................................................ 438/287
See application file for complete search history.

(56) References Cited

U.S. PATENT DOCUMENTS

| | | | | |
|---|---|---|---|---|
| 6,498,106 | B1 * | 12/2002 | Hsin et al. | 438/704 |
| 6,528,390 | B2 * | 3/2003 | Komori et al. | 438/452 |
| 6,872,667 | B1 * | 3/2005 | Shieh et al. | 438/700 |
| 7,250,654 | B2 * | 7/2007 | Chen et al. | 257/324 |
| 7,288,452 | B2 | 10/2007 | Lee | |
| 2005/0142757 | A1 * | 6/2005 | Lee et al. | 438/258 |
| 2008/0311694 | A1 * | 12/2008 | Kawasaki et al. | 438/31 |
| 2009/0072274 | A1 * | 3/2009 | Knoefler et al. | 257/204 |

* cited by examiner

*Primary Examiner* — Charles Garber
*Assistant Examiner* — Reema Patel
(74) *Attorney, Agent, or Firm* — Winston Hsu; Scott Margo

(57) ABSTRACT

A method for fabricating SONOS memory is disclosed. The method includes the steps of: providing a semiconductor substrate; forming a first silicon oxide layer, a silicon nitride layer, and a second silicon oxide layer on the surface of the semiconductor substrate; forming a hard mask on the second silicon oxide layer; patterning the hard mask, the second silicon oxide layer, the silicon nitride layer, and the first silicon oxide layer to form a patterned hard mask and a stacked structure; forming a gate oxide layer on surface of the patterned hard mask; removing the gate oxide layer and the patterned hard mask; forming a patterned polysilicon layer on surface of the stacked structure; and forming a source/drain region in the semiconductor substrate adjacent to two sides of the polysilicon layer.

18 Claims, 5 Drawing Sheets

METHOD FOR FABRICATING A SONOS MEMORY

BACKGROUND OF THE INVENTION

1. Field of the Invention

The invention relates to a method for fabricating SONOS memory, and more particularly to a method of maintaining the ratio of the ONO structure of the SONOS memory.

2. Description of the Prior Art

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased electrically.

Product development efforts in memory device technology have focused on increasing the programming speed, lowering programming and reading voltages, increasing data retention time, reducing cell erasure times and reducing cell dimensions. Some of the flash memory arrays today utilize a gate structure made of dual polysilicon layers (also refers to as the dual poly-Si gate). The polysilicon layer utilized in these gate structures often includes a dielectric material composed of an oxide-nitride-oxide (ONO) structure. When the device is operating, electrons are injected from the substrate into the bottom layer of the dual polysilicon layers for storing data. Since these dual gate arrays typically store only one single bit of data, they are inefficient for increasing the capacity of the memory. As a result, a flash memory made of silicon-oxide-nitride-oxide-silicon (SONOS) is derived. Preferably, a transistor from these memories is capable of storing two bits of data simultaneously, which not only reduces the size of the device but also increases the capacity of the memory significantly. The operation of a typical SONOS memory is described below.

During the programming of a typical SONOS memory, electrical charge is transferred from a substrate to the charge storage layer in the device, such as the nitride layer in the SONOS memory. Voltages are applied to the gate and drain creating vertical and lateral electric fields, which accelerate the electrons along the length of the channel. As the electrons move along the channel, some of them gain sufficient energy to become trapped in the charge storage dielectric material. This jump is known as hot carrier injection, in which the hot carriers being the electrons. Charges are trapped near the drain region as the electric fields are strongest near the drain. Reversing the potentials applied to the source and drain will cause electrons to travel along the channel in the opposite direction and be injected into the charge storage dielectric layer near the source region. Since part of the charge storage dielectric layer are electrically conductive, the charged introduced into these parts of the charge storage dielectric material tend to remain localized. Accordingly, depending upon the application of voltage potentials, electrical charge can be stored in discrete regions within a single continuous charge storage dielectric layer.

According to a conventional approach for integrating SONOS transistor and MOS transistor, a patterned ONO stacked structure is first formed on the semiconductor substrate of the memory region and a gate oxide layer is deposited directly on the top most silicon oxide layer of the ONO stacked structure and the semiconductor substrate of the transistor region. Unfortunately, the stacking of the gate oxide layer and the silicon oxide layer from the ONO stacked structure not only changes the thickness ratio of the entire ONO stacked structure but also affects the operation of the SONOS memory substantially. Hence, how to improve the conventional SONOS memory fabrication and maintain the thickness ratio of the ONO stacked structure in the memory unit has become an important task.

SUMMARY OF THE INVENTION

It is an objective of the present invention to provide a method for fabricating SONOS memory for resolving the aforementioned problem met by conventional approach.

According to a preferred embodiment of the present invention, a method for fabricating SONOS memory is disclosed. The method includes the steps of: providing a semiconductor substrate; forming a first silicon oxide layer, a silicon nitride layer, and a second silicon oxide layer on the surface of the semiconductor substrate; forming a hard mask on the second silicon oxide layer; patterning the hard mask, the second silicon oxide layer, the silicon nitride layer, and the first silicon oxide layer to form a patterned hard mask and a stacked structure; forming a gate oxide layer on surface of the patterned hard mask; removing the gate oxide layer and the patterned hard mask; forming a patterned polysilicon layer on surface of the stacked structure; and forming a source/drain region in the semiconductor substrate adjacent to two sides of the polysilicon layer.

Another embodiment of the present invention provides a method for fabricating SONOS memory, in which the method includes the steps of: providing a semiconductor substrate with a memory region and a transistor region; forming a first silicon oxide layer, a silicon nitride layer, a second silicon oxide layer on the semiconductor substrate of the memory region and the transistor region; forming a hard mask on surface of the second silicon oxide layer; patterning the hard mask, the second silicon oxide layer, the silicon nitride layer, and the first silicon oxide layer to form a patterned hard mask and a stacked structure in the memory region; forming a gate oxide layer on surface of the patterned hard mask and the transistor region; removing the gate oxide layer from the memory region; removing the patterned hard mask from the memory region; forming a patterned polysilicon layer on the stacked structure of the memory region and the transistor region respectively; and forming a source/drain region in the semiconductor substrate adjacent to two sides of the polysilicon layer in the memory region and the transistor region respectively.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
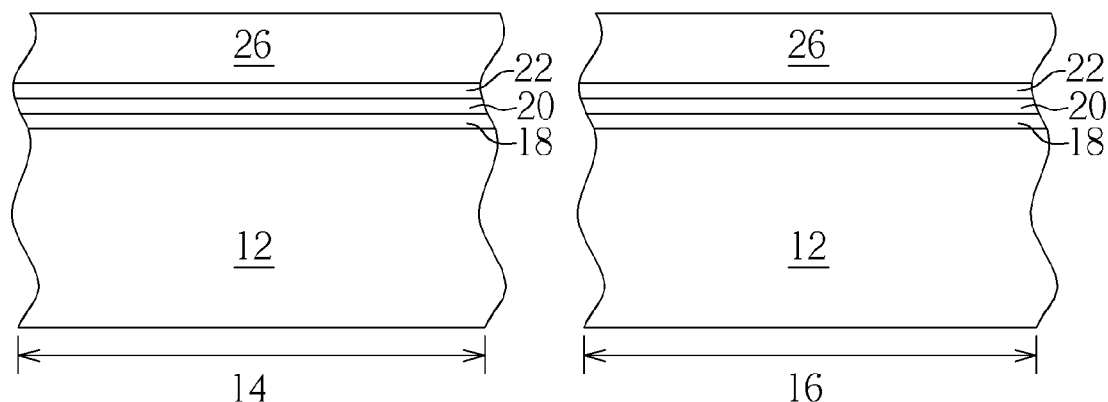
FIGS. 1-9 illustrate a method for fabricating a SONOS memory according to a preferred embodiment of the present invention.

Referring to FIGS. 1-9, FIGS. 1-9 illustrate a method for fabricating a SONOS memory according to a preferred embodiment of the present invention. As shown in FIG. 1, a semiconductor substrate 12, such as a substrate composed of AsGa, silicon on insulator (SOI) layer, epitaxial layer, SiGe layer or other semiconductor material is provided. A memory region 14 and a transistor region 16 are defined on the semiconductor substrate 12, and a first silicon oxide layer 18, a silicon nitride layer 20, a second silicon oxide layer 22, and a hard mask 26 are formed on surface of the entire semiconductor substrate 12. The hard mask 26 is preferably composed of silicon nitride, and the thickness of the hard mask 26 is between 100-200 angstroms, and preferably at 150 angstroms.

Figure 2:
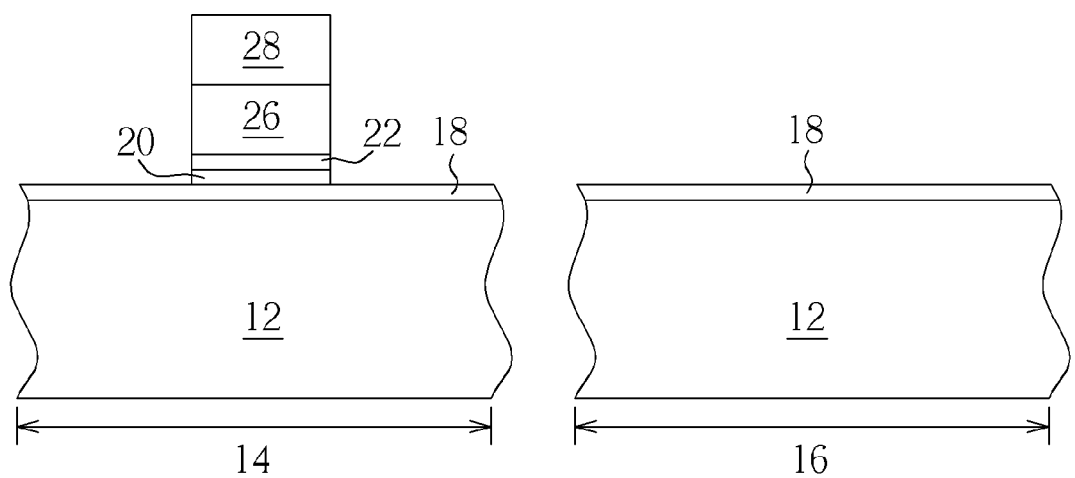

As shown in FIG. 2, a patterned photoresist 28 is formed on the hard mask 26 of the memory region 14, and a dry etching process is conducted by using the patterned photoresist 28 as mask to remove a portion of the hard mask 26, a portion of the second silicon oxide layer 22, and a portion of the silicon nitride layer 20 of the memory region 14, and the hard mask 26, the second silicon oxide layer 22, and the silicon nitride layer 20 of the transistor region 16. The dry etching process preferably stops at the surface of the first silicon oxide layer 18.

Figure 3:
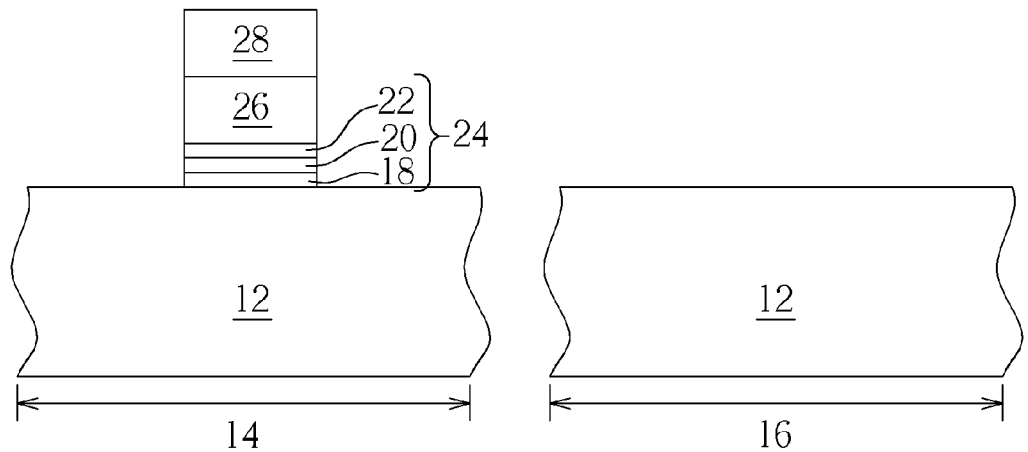

As shown in FIG. 3, a wet etching process is conducted by using the patterned photoresist 28 as mask to remove only a portion of the first silicon oxide layer 18 of the memory region 14 and the entire first silicon oxide layer 18 of the transistor region 16 for forming a ONO stacked structure 24 in the memory region 14.

Figure 4:
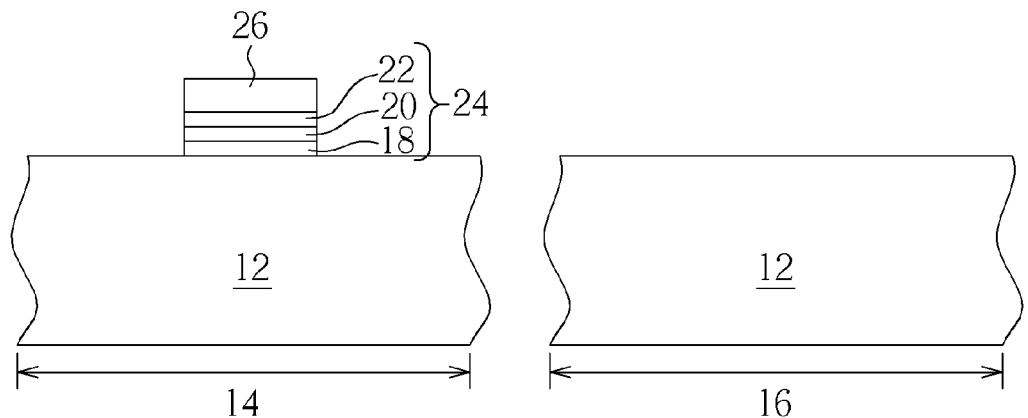

As shown in FIG. 4, a cleaning process is conducted by using sulfuric acid-hydrogen peroxide mixture (SPM) to strip the patterned photoresist 28. It should be noted despite a portion of the hard mask 26 is removed during the cleaning process, major portion of the hard mask 26 is still disposed on the surface of the second silicon oxide layer 22, such that only the memory region 14 of the semiconductor substrate 12 includes an ONO stacked structure 24 and a hard mask 26 is disposed on top of this ONO stacked structure 24. In this embodiment, the remaining thickness of the hard mask 26 after the SPM cleaning process is preferably between 60-80 angstroms.

Figure 5:
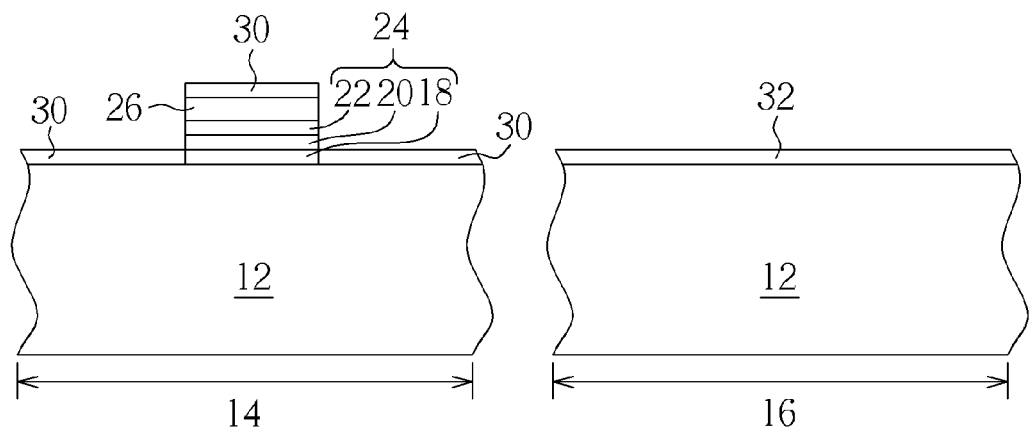
Figure 6:
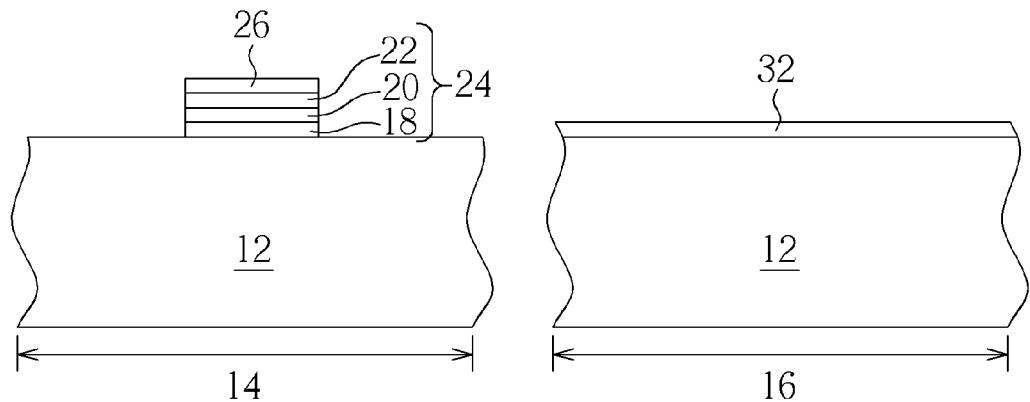

As shown in FIG. 5, an in-situ steam generation (ISSG) process is conducted to form a gate oxide layer 30 on surface of the semiconductor substrate 12 and the hard mask 26 of the memory region 14 and also a gate oxide layer 32 on surface of the semiconductor substrate 12 of the transistor region 16. In this embodiment, the thickness of the gate oxide layers 30/32 is approximately 30 angstroms.

It should be noted that the in-situ steam generation process is preferably an invasive oxide growth process, hence a portion of the hard mask 26 is preferably consumed as the gate oxide layer 30 is formed on the surface of the hard mask 26. According to the preferred embodiment of the present invention, the thickness of the remaining hard mask 26 after the ISSG process is between 40-50 angstroms. Despite a portion of the hard mask 26 is consumed during the process for growing the gate oxide layer 30, the remaining hard mask 26 is still used to maintain the thickness ratio of the stacked structure 24, including the first silicon oxide layer 18, the silicon nitride layer, and the second silicon oxide layer 22.

Figure 7:
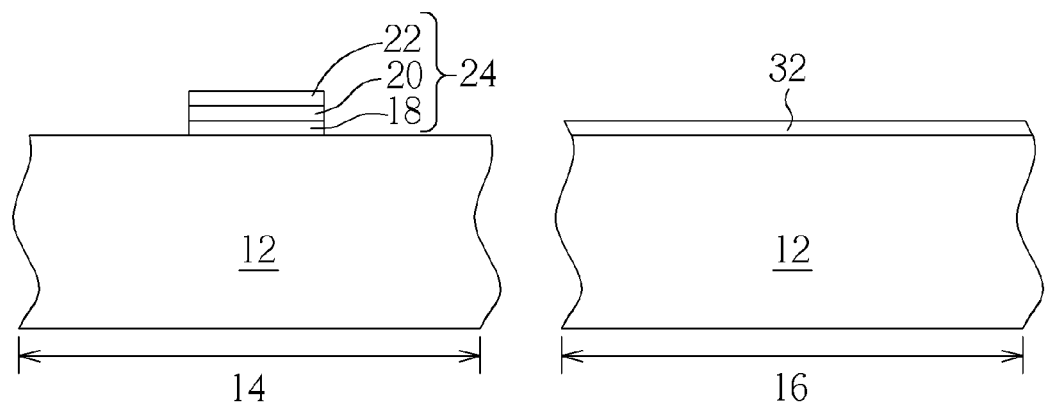

A patterned photoresist (not shown) is then formed on a portion of the transistor region 16 while exposing a portion of the gate oxide layer 30 of the memory region 14, and as shown in FIG. 16, a wet etching process is carried out to remove a portion of the gate oxide layer of the transistor region 16 and the gate oxide layer 30 of the memory region 14. Next, as shown in FIG. 7, a SPM is used to remove the patterned photoresist and the hard mask 26 from the memory region 14 for exposing the top second oxide layer 22 of the stacked structure 24.

Preferably, the transistor region 16 further includes an input/output (I/O) region and a core region, and the aforementioned patterned photoresist is preferably formed on the semiconductor substrate 12 of the I/O region. Hence, as the above wet etching process is conducted to remove the gate oxide layer 30 from the memory region 14, the gate oxide layer disposed in the core region is also removed simultaneously. Next, another ISSG process is performed to form a gate oxide layer with lower thickness in the core region. In other words, two gate oxide layers with different thickness are disposed on surface of the semiconductor substrate 12 of the I/O region and the core region respectively.

Figure 8:
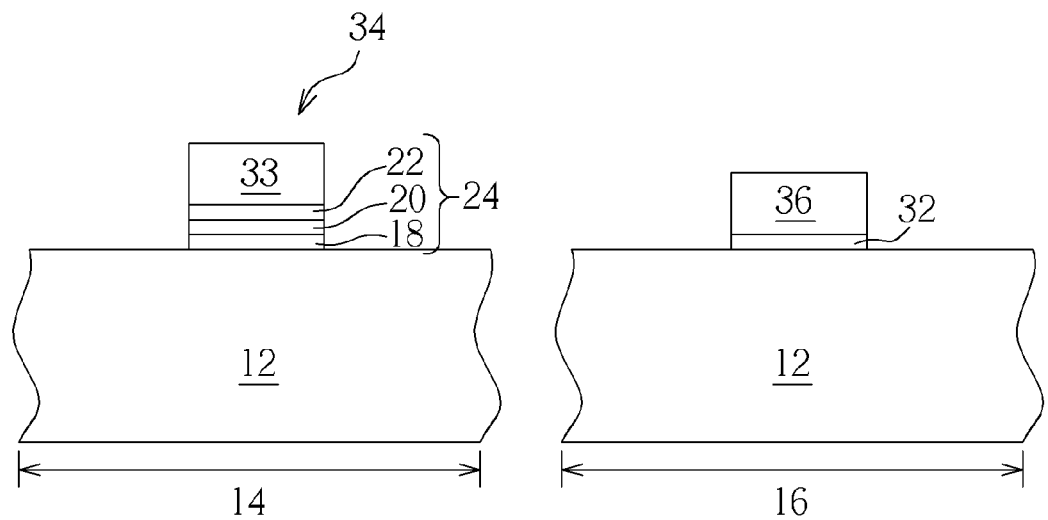

As shown in FIG. 8, a polysilicon layer (not shown) is formed on the semiconductor substrate 12 of the memory region 14 and the transistor region 16, in which the polysilicon layer disposed on the memory region 14 preferably covers the surface of the stacked structure 24 and the semiconductor substrate 12 while the polysilicon layer disposed on the transistor region 16 covers the surface of the gate oxide layer 32. Next, a pattern transfer process is conducted, such as by using a patterned photoresist (not shown) as mask to etch away a portion of the polysilicon layer for forming a stacked gate 34 in the memory region 14 and a gate electrode 36 in the transistor region 16.

The stacked gate 34 is preferably includes a control gate electrode composed of patterned polysilicon layer 33 and the ONO stacked structure composed of the second silicon oxide layer 22, the silicon nitride layer 22 and the first silicon oxide layer 18. As stated previously, the silicon nitride layer 20 could be used as a charge storage layer during the programming and erasing stage.

Figure 9:
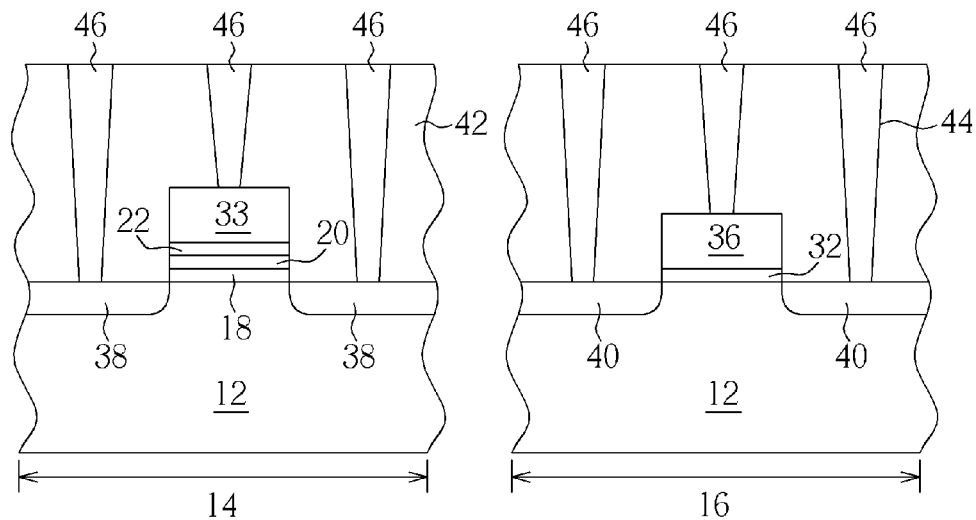

As shown in FIG. 9, an ion implantation process is performed by using the stacked gate 34 and the gate electrode 36 as mask to form source/drain regions 38/40 in the semiconductor substrate 12 adjacent to two sides of the stacked gate 34 and the gate electrode 36.

Next, an inter-layer dielectric layer (ILD) 42 is formed on the semiconductor substrate 12 of the memory region 14 and the transistor region 16 while covering the stacked gate 34 and the gate electrode 36. Another pattern transfer is performed thereafter by using a patterned photoresist (not shown) as mask to etch a portion of the ILD 42 for forming a plurality of vias 44 in the ILD 42. A metal layer composed of tungsten (W) or other metals is formed on the ILD 42 and deposited in each vias 44 to form a plurality of contact plugs 46. This completes the fabrication of a SONOS memory unit, which preferably includes a SONOS transistor and a MOS transistor. Despite the aforementioned fabrication involves an integration of a SONOS transistor and a MOS transistor, the present invention could also implement the process conducted only in the memory region 14 to fabricate only the SONOS transistor, which is also within the scope of the present invention.

According to another embodiment of the present invention, the aforementioned SONOS transistor could also be utilized in a non-volatile static random access memory (NVSRAM), which preferably has the advantages of the volatile and the non-volatile memory device. The NVSRAM device according to the present invention includes a memory cell array, a plurality of bit lines, and a plurality of word lines. The memory cell array includes multiple columns of NVSRAM cells in the vertical direction and multiple rows of NVSRAM cells in the horizontal direction. The bit lines extend to all overlapping NVSRAM cells in a direction parallel to the vertical columns of the memory cell array, while the word lines extend to all overlapping NVSRAM cells in a direction parallel to the horizontal rows of the memory cell array. In the memory array, each NVSRAM cell has identical structure, each vertical column of the NVSDRAM cells shares a corresponding pair of bit lines BT and BC, and each horizontal row of the NVSDRAM cells shares a corresponding word line WL.

Figure 10:
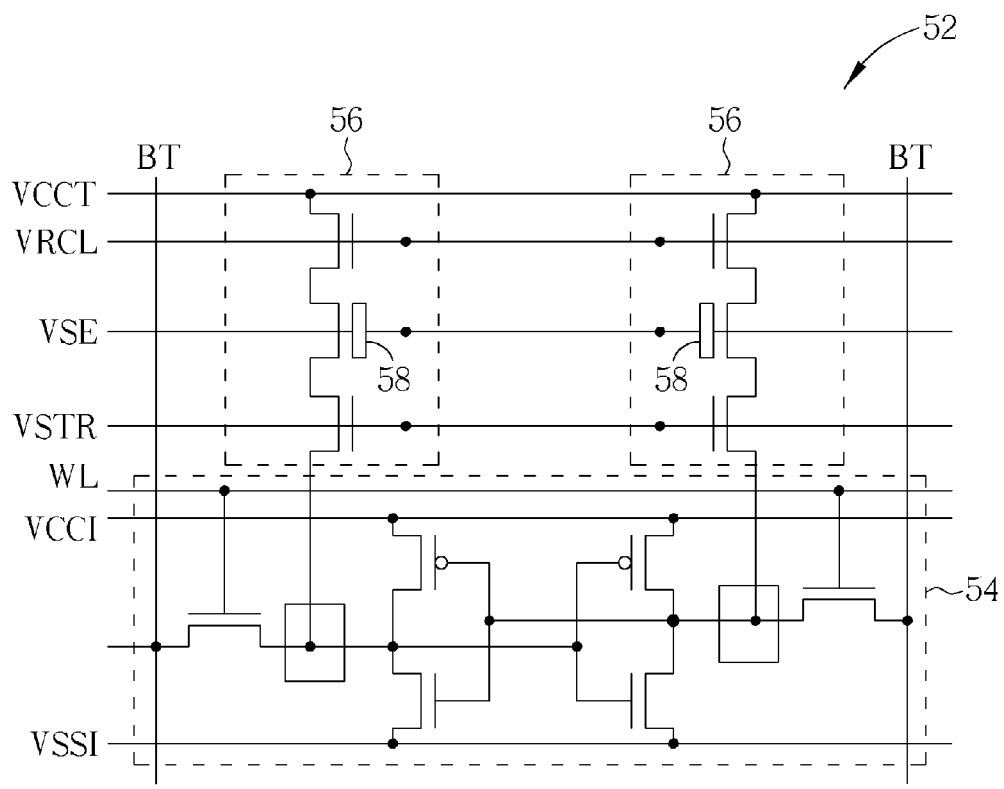
FIG. 10 illustrates a schematic equivalent circuit diagram of implementing the aforementioned SONOS transistor to a NVSRAM cell according an embodiment of the present invention.

Referring to FIG. 10, which illustrates a schematic equivalent circuit diagram of implementing the aforementioned SONOS transistor to a NVSRAM cell according an embodiment of the present invention. As shown in the figure, a NVSRAM cell 52 of a memory array includes a volatile circuit 54 and two sets of 3T-SONOS units 56. Each of the 3T-SONOS unit 56 is composed of an aforementioned SONOS transistor 58 and two MOS transistors. The volatile circuit 54 is composed of a 6 transistor (6T) structure, in which the transistors in the volatile circuit 54 are preferably MOS transistors.

As power is turned on, data are preferably stored in the NVSRAM cell 52 through the volatile circuit 54, and when the power is turned off, the NVSRAM cell 52 is able to restore signals or data to the 3T-SONOS unit 56. The stored data could be retrieved when the power is returned back on and by transforming the volatile function to non-volatile function, a memory storage effect could be achieved.

Overall, the present invention preferably forms an ONO stacked structure in the memory region and covers a hard mask on surface of the ONO stacked structure, and then uses a patterned photoresist to pattern the ONO stacked structure. As the hard mask is deposited with a greater thickness, at least a portion of the hard mask is remained on the patterned ONO structure as the patterned photoresist is removed. Next, the ISSG process preferably grows a gate oxide layer directly on surface of the remaining hard mask and the gate oxide layer and the hard mask disposed in the memory region are removed subsequently with the patterning of the gate oxide layer in the transistor region. As the ONO stacked in the memory region is protected by the hard mask during the entire fabrication process, the present invention not only maintains the thickness ratio of the ONO stacked structure without any extra process, but also adequately exposes the ONO stacked structure in the memory region after the gate oxide layer in the transistor region is patterned for the deposition of polysilicon layer. Accordingly, a SONOS memory unit with stabilized performance is fabricated.

Those skilled in the art will readily observe that numerous modifications and alterations of the device and method may be made while retaining the teachings of the invention.

What is claimed is:

1. A method for fabricating SONOS memory, comprising:
   providing a semiconductor substrate;
   forming a first silicon oxide layer, a silicon nitride layer, and a second silicon oxide layer on the surface of the semiconductor substrate;
   forming a hard mask on the second silicon oxide layer;
   patterning the hard mask, the second silicon oxide layer, the silicon nitride layer, and the first silicon oxide layer to form a patterned hard mask and a stacked structure;
   forming a gate oxide layer on surface of the patterned hard mask;
   removing the gate oxide layer before removing the patterned hard mask;
   forming a patterned polysilicon layer on surface of the stacked structure; and
   forming a source/drain region in the semiconductor substrate adjacent to two sides of the polysilicon layer.

2. The method of claim 1, wherein the step of patterning the hard mask, the second silicon oxide layer, the silicon nitride layer, and the first silicon oxide layer comprises:
   forming a patterned photoresist on surface of the hard mask;
   using the patterned photoresist to remove a portion of the hard mask, a portion of the second silicon oxide layer, and a portion of the silicon nitride layer;
   removing a portion of the first silicon oxide layer; and
   removing the patterned photoresist.

3. The method of claim 2, further comprising performing a dry etching process for removing a portion of the hard mask, a portion of the second silicon oxide layer, and a portion of the silicon nitride layer.

4. The method of claim 2, further comprising performing a wet etching process for removing a portion of the first silicon oxide layer.

5. The method of claim 2, further comprising using a sulfuric acid-hydrogen peroxide mixture (SPM) to remove the patterned photoresist.

6. The method of claim 1, wherein the hard mask comprises silicon nitride.

7. The method of claim 1, further comprising performing an in-situ steam generation (ISSG) process for forming the gate oxide layer.

8. The method of claim 1, further comprising performing a wet etching process for removing the gate oxide layer.

9. The method of claim 1, further comprising using a SPM for removing the hard mask.

10. A method for fabricating SONOS memory, comprising:
    providing a semiconductor substrate with a memory region and a transistor region;
    forming a first silicon oxide layer, a silicon nitride layer, a second silicon oxide layer on the semiconductor substrate of the memory region and the transistor region;
    forming a hard mask on surface of the second silicon oxide layer;
    patterning the hard mask, the second silicon oxide layer, the silicon nitride layer, and the first silicon oxide layer to form a patterned hard mask and a stacked structure in the memory region;
    forming a gate oxide layer on surface of the patterned hard mask and the semiconductor substrate of the transistor region;
    removing the gate oxide layer from the memory region before removing the patterned hard mask from the memory region;
    forming a patterned polysilicon layer on the stacked structure of the memory region and the transistor region respectively; and
    forming a source/drain region in the semiconductor substrate adjacent to two sides of the polysilicon layer in the memory region and the transistor region respectively.

11. The method of claim 10, wherein the step of patterning the hard mask, the second silicon oxide layer, the silicon nitride layer, and the first silicon oxide layer comprises:
    forming a patterned photoresist on surface of the hard mask of the memory region;
    using the patterned photoresist to remove a portion of the hard mask, a portion of the second silicon oxide layer, and a portion of the silicon nitride layer from the memory region and the hard mask, the second silicon oxide layer, and the silicon nitride layer from the transistor region;
    removing a portion of the first silicon oxide layer from the memory region and the transistor region; and
    removing the patterned photoresist.

12. The method of claim 11, further comprising performing a dry etching process for removing a portion of the hard mask, a portion of the second silicon oxide layer, and a portion of the silicon nitride layer.

13. The method of claim 11, further comprising performing a wet etching process for removing a portion of the first silicon oxide layer.

14. The method of claim 11, further comprising using a sulfuric acid-hydrogen peroxide mixture (SPM) to remove the patterned photoresist.

15. The method of claim 10, wherein the hard mask comprises silicon nitride.

16. The method of claim 10, further comprising performing an in-situ steam generation process for forming the gate oxide layer.

17. The method of claim 10, further comprising performing a wet etching process for removing the gate oxide layer.

18. The method of claim 10, further comprising using a SPM for removing the hard mask.

* * * * *